(12) United States Patent
Nakagawa

(10) Patent No.: US 7,929,867 B2
(45) Date of Patent: Apr. 19, 2011

(54) EMERGENCY LAMP AND WIRELESS EMERGENCY LAMP DATA TRANSMISSION SYSTEM

(75) Inventor: Masao Nakagawa, Kanagawa (JP)

(73) Assignee: Nakagawa Laboratories, Inc., Tokyo (JP)

( * ) Notice: Subject to any disclaimer, the term of this patent is extended or adjusted under 35 U.S.C. 154(b) by 0 days.

(21) Appl. No.: 12/461,229

(22) Filed: Aug. 5, 2009

(65) Prior Publication Data

US 2009/0297157 A1     Dec. 3, 2009

Related U.S. Application Data

(63) Continuation of application No. 10/532,250, filed as application No. PCT/JP03/13539 on Oct. 23, 2003, now Pat. No. 7,583,901.

(30) Foreign Application Priority Data

| Oct. 24, 2002 | (JP) | 2002-309557 |
|---|---|---|
| Dec. 4, 2002 | (JP) | 2002-352075 |
| Jan. 10, 2003 | (JP) | 2003-004560 |
| Feb. 17, 2003 | (JP) | 2003-037746 |
| Mar. 14, 2003 | (JP) | 2003-070673 |
| Mar. 25, 2003 | (JP) | 2003-082278 |
| Mar. 26, 2003 | (JP) | 2003-084819 |
| Jun. 6, 2003 | (JP) | 2003-161859 |
| Jun. 23, 2003 | (JP) | 2003-177816 |
| Sep. 16, 2003 | (JP) | 2003-323052 |

(51) Int. Cl.
*H04B 10/10*       (2006.01)

(52) U.S. Cl. .................................................... 398/172
(58) Field of Classification Search .................. 398/172
See application file for complete search history.

(56) References Cited

U.S. PATENT DOCUMENTS

| 5,602,668 A | 2/1997 | Kuchta |
| 5,633,629 A * | 5/1997 | Hochstein ............... 340/907 |
| 2002/0167701 A1 | 11/2002 | Hirata |
| 2003/0043972 A1 | 3/2003 | Burnham et al. |

FOREIGN PATENT DOCUMENTS

| DE | 41 37 032 A1 | 5/1993 |
| GB | 2186457 A | 8/1987 |

(Continued)

OTHER PUBLICATIONS

International Search Report mailed on Feb. 24, 2004.

(Continued)

*Primary Examiner* — Leslie Pascal
(74) *Attorney, Agent, or Firm* — Rader, Fishman & Grauer PLLC

(57) ABSTRACT

An LED is used as a light source of the emergency light. Data are normally received through a power line, demodulated at a modem section, and stored in a data memory. In an emergency, a change sectio switches the power line to a battery, and LED emits light and functions as the emergency light. At this time, the data stored in the data memory is read and demodulated at a light modulation section, and used to control blinking of the LED and the light intensity. Thereby, the data can be transmitted by the light. In an emergency, information on an emergency exit, an escape route, etc. can be received, if a mobile terminal having a light-receiving section receives the light from the emergency light.

7 Claims, 3 Drawing Sheets

FOREIGN PATENT DOCUMENTS

| | | | |
|---|---|---|---|
| JP | 56-40334 | A | 4/1981 |
| JP | 59-038253 | A | 3/1984 |
| JP | 59-058406 | A | 4/1984 |
| JP | 59-86971 | A | 5/1984 |
| JP | 62-048129 | A | 3/1987 |
| JP | 62-173895 | A | 7/1987 |
| JP | 63-187102 | A | 8/1988 |
| JP | 63-199303 | A | 8/1988 |
| JP | 63-269106 | A | 11/1988 |
| JP | 01-122220 | A | 5/1989 |
| JP | 02-284533 | A | 11/1990 |
| JP | 04-007159 | B2 | 1/1992 |
| JP | 04-131000 | A | 5/1992 |
| JP | 05-062505 | A | 3/1993 |
| JP | 05-281393 | A | 10/1993 |
| JP | 05-302006 | A | 11/1993 |
| JP | 06-325264 | A | 11/1994 |
| JP | 06-350534 | A | 12/1994 |
| JP | 07-169572 | A | 7/1995 |
| JP | 07-186955 | A | 7/1995 |
| JP | 08-067203 | A | 3/1996 |
| JP | 08-299475 | A | 11/1996 |
| JP | 08-330077 | A | 12/1996 |
| JP | 09-019084 | A | 1/1997 |
| JP | 09-44627 | A | 2/1997 |
| JP | 09-179512 | A | 7/1997 |
| JP | 10-066167 | A | 3/1998 |
| JP | 10-157621 | A | 6/1998 |
| JP | 11-088264 | A | 3/1999 |
| JP | 11-127170 | A | 5/1999 |
| JP | 11-234210 | A | 8/1999 |
| JP | 11-266190 | A | 9/1999 |
| JP | 2000-029400 | A | 1/2000 |
| JP | 2000-67377 | A | 3/2000 |
| JP | 2000-081516 | A | 3/2000 |
| JP | 2001-036592 | A | 2/2001 |
| JP | 2001-052501 | A | 2/2001 |
| JP | 2001036592 | A | 2/2001 |
| JP | 2001-176678 | A | 6/2001 |
| JP | 2001-243807 | A | 9/2001 |
| JP | 2002-508608 | A | 3/2002 |
| JP | 2002-144984 | A | 5/2002 |
| JP | 2002-148442 | A | 5/2002 |
| JP | 2002-190776 | A | 7/2002 |
| JP | 2002-261334 | A | 9/2002 |
| JP | 2002-274860 | A | 9/2002 |
| JP | 2002-290335 | A | 10/2002 |
| JP | 2002-344478 | A | 11/2002 |
| JP | 2003-318836 | A | 11/2003 |
| JP | 2004-185359 | A | 7/2004 |
| JP | 2004-221747 | A | 8/2004 |
| JP | 2004-229273 | A | 8/2004 |
| JP | 2004-265774 | A | 9/2004 |
| JP | 2004-282389 | A | 10/2004 |
| JP | 2004-297295 | A | 10/2004 |
| JP | 2004-363756 | A | 12/2004 |
| WO | WO-0163788 | A2 | 8/2001 |
| WO | WO-0215413 | A2 | 2/2002 |
| WO | WO-02/25842 | A2 | 3/2002 |

OTHER PUBLICATIONS

Komine et al., Integrated System of White LED Visible-Light Communication and Electrical Power-Line Communication: Dept. of Information and Computer Science, Faculty of Science and Technology, Keio University, The Institute of Electronics, Information and Communication Engineers, Technical Report of IEICE, pp. 1-6.
Komine et al., Integrated System of White LED Visible-Light Communication and Electrical Power-Line Communication: Dept. of Information and Computer Science, Faculty of Science and Technology, Keio University, The Institute of Electronics, Information and Communication Engineers, Technical Report of IEICE, pp. 1-6.
Notice of Rejection mailed Mar. 29, 2006.
European Search Report dated Mar. 14, 2006.
Komine T et al.: "Integrated system of white led visible-light communication and power-line communication" Personal, Indoor and Mobile Radio Communications, 2002, Piscataway, NJ, USA, IEEE, vol. 4, Sep. 15, 2002, pp. 1762-1766.
Japanese Office Action for application No. 2003-004560 dated Sep. 17, 2008.
Japanese Office Action for application No. 2003-037746 Sep. 17, 2008.
European Search Report mailed on Dec. 8, 2005.
PCT/ISA/210 (Jul. 1988).
PCT/ISA/206 (Jul. 1992).
Communication from European Patent Office for application No. 07016825.7 dated Oct. 10, 2007.
Communication from European Patent Office for application No. 07017127.7 dated Oct. 11, 2007.
Communication from European Patent Office for application No. 07017123.6 dated Nov. 6, 2007.
Communication from European Patent Office for application No. 07017125.1 dated Oct. 25, 2007.
Japanese Office Action for Application No. 2002-352075 draft date of May 15, 2006.
Japanese Office Action for Application No. 2002-352075 draft date of Sep. 12, 2006.
Extended European Search Report for Application No. 07017126.9 dated Oct. 30, 2007.
Japanese Office Action for Application No. 2003-323052 dated Jun. 30, 2008.
European Patent Office Communication pursuant to Article 94(3) EPC for Application No. 07 016 825.7 dated Oct. 23, 2008.
European Patent Office Communication pursuant to Article 94(3) EPC for Application No. 07 017 123.6 dated Nov. 20, 2008.
Japanese Office Action for Application No. 2003-070673 dated Dec. 8, 2008.
Japanese Office Action for Application No. 2003-084819 dated Dec. 8, 2008.
European Patent Office Communication pursuant to Article 94(3) EPC for Application No. 07 016 825.7 dated Mar. 9, 2009.
European Patent Office Communication pursuant to Article 94(3) EPC for Application No. 07 017 123.6 dated Feb. 16, 2009.
Japanese Office Action for Application No. 2003-070673 dated Oct. 15, 2009.

* cited by examiner

EMERGENCY LAMP AND WIRELESS EMERGENCY LAMP DATA TRANSMISSION SYSTEM

CROSS-REFERENCES TO RELATED APPLICATIONS

This application is a continuation of U.S. patent application Ser. No. 10/532,250 filed Oct. 23, 2003, as International Application No. PCT/JP03/013539, now pending, the contents of which, including specification, claims and drawings, are incorporated herein by reference in their entirety. This application claims priority from Japanese Patent Application Serial No. 2002-352075 filed Dec. 4, 2002, the contents of which are incorporated herein by reference in their entireties.

BACKGROUND OF THE INVENTION

An exemplary application, according to the present invention, aims to provide an emergency light including a light source having excellent electric power efficiency and long operating life, a wireless emergency light data transmission system that uses the emergency light as a data transmission source while in an emergency, and an emergency light that is used in the system.

To attain this objective, an emergency light, which is embedded with a battery and turns a light source on while in an emergency without electric power supplied from an external power source, is characterized by the light source made up of LEDs. The feature of LEDs or high electric power efficiency allows suppression of battery consumption. Reduced battery size allows reduction in device size. Moreover, extended operating life as to light emitting time is provided. Moreover, since LEDs have a long operating life, intervals between maintenance such as light source replacement intervals can be extended, which allows reduction in maintenance cost. Furthermore, since LEDs are highly crash proof, an available emergency light that will not be damaged due to a devastating disaster can be provided.

The emergency light further includes a storage unit that is stored with data to be transmitted while in an emergency and an optical modulator that controls electric power supplied to the LEDs in accordance with data stored in the storage unit, so as for the LEDs to change light intensity or blink. As described above, since LEDs have an excellent response speed characteristic, modulation based on such data is possible, and light for displaying can be used for data transmission as is. With such structure, the emergency light, which is conventionally used merely for indicating an emergency exit and an emergency staircase, can be used as a data source while in an emergency. At this time, since the light source, which functions as an emergency light, is used as is, it never consumes large electric power as opposed to the case of voice output. As a result, most of electric power consumption is expected to be an amount for only the light source. As a result, there is no need to provide an additional large-capacity battery for transmitting data, thereby allowing the light source to operate as a data source with a battery provided for display.

Alternatively, a demodulator may be provided, so as to separate data, which is superimposed on a voltage of an external power source and then transmitted, while being driven by an external power source while not at a time other than in an emergency. Data provided from the modulator is then stored in a storage unit. Such a structure allows distribution of data, which is to be transmitted while in an emergency, to respective emergency lights via the power line while not in an emergency. As a result, data to be transmitted while in an emergency can be easily set and updated.

According to the present invention, a wireless emergency light data transmission system for transmitting data to a terminal using an emergency light, which has a light source turned on while in an emergency without electric power supplied from an external power source, is provided. In the wireless emergency light data transmission system, the emergency light includes a battery, an LED that is used as a light source, a storage unit that is stored with data to be transmitted while in an emergency, and an optical modulator that controls electric power supplied to the LED in accordance with data stored in the storage unit, thereby controlling light intensity or blinking of the LED. The terminal includes a light receiving unit that receives light emitted from the LED in the emergency light and converts it to an electric signal, and a demodulator that demodulates the electric signal output from the light receiving unit, thereby capturing the data. This structure allows optical data transmission from an emergency light to a terminal while in an emergency. Various pieces of data such as escape routes for evacuees, informing destination, or a map and descriptive text data for floors can be displayed on the terminal, which allows smoothly guiding users to evacuate while in an emergency.

BRIEF DESCRIPTION OF THE DRAWINGS

FIG. 2A shows an appearance of an emergency light when a cover is removed; FIG. 2B shows an exemplary LED array to be used; and FIG. 2C shows an another example of a pictorial mark formed on the cover.

DISCLOSURE OF THE INVENTION

Of various display apparatus, emergency lights semi-permanently continue to illuminate and are hardly ever switched off once they are switched on. As a provision against accidents such as a fire or a disaster, many emergency lights are deployed in plain view, such as in a building, a theater, a film theater, a hospital, an airport, and a station. The majority of present emergency lights uses a fluorescent lamp as a light source. Since it is expected that external electric power may be turned off when a disaster occurs, an internal battery is used to supply electric power to emergency lights to illuminate while in an emergency. Fluorescent lamps having better electric power efficiency than incandescent bulbs are used for effective utilization of limited electric power. Meanwhile, reduction in maintenance cost using a light source having further excellent electric power efficiency and a long-lived light source has been required. As described above, LEDs have excellent electric power efficiency and a long operating life, but they have not been considered to be used as emergency lights. As merely disclosed in Japanese Patent Application Laid-Open No. Hei 9-19084, there is a case that LEDs are used as a secondary light source to display a state of charge, for example. However, LEDs have never been used as a main light source for emergency lights.

In addition, ordinary emergency lights deployed in place merely provide visual information of where emergency exits and emergency staircases are located. There is relevant information disclosed in, for example, Japanese Patent Application Laid-Open No. Hei 8-299475 in which a voice guiding mechanism is provided and Japanese Patent Application Laid-Open No. Hei 8-67203 in which radio broadcasting is used. However, large electric power is needed for voice output. Therefore, a large-capacity battery must be embedded for visual indication of the emergency exits, which is the first principle for the emergency lights, and for voice output, thereby developing problems of increase in cost and system size.

On the other hand, since LEDs have a high-speed response characteristic and can be modulated at a high speed, use of LEDs for optical data communication has been studied. The idea of using these features and carrying out illumination and communication at the same time has been well-known. However, ordinary lighting elements are switched off when power supply stops due to a disaster. Therefore, those devices cannot be used while in an emergency, and there has been no communication system established assuming an emergency.

In order to solve such problems, the present invention shows an exemplary application of light emitted from emergency lights for communication.

Figure 1:
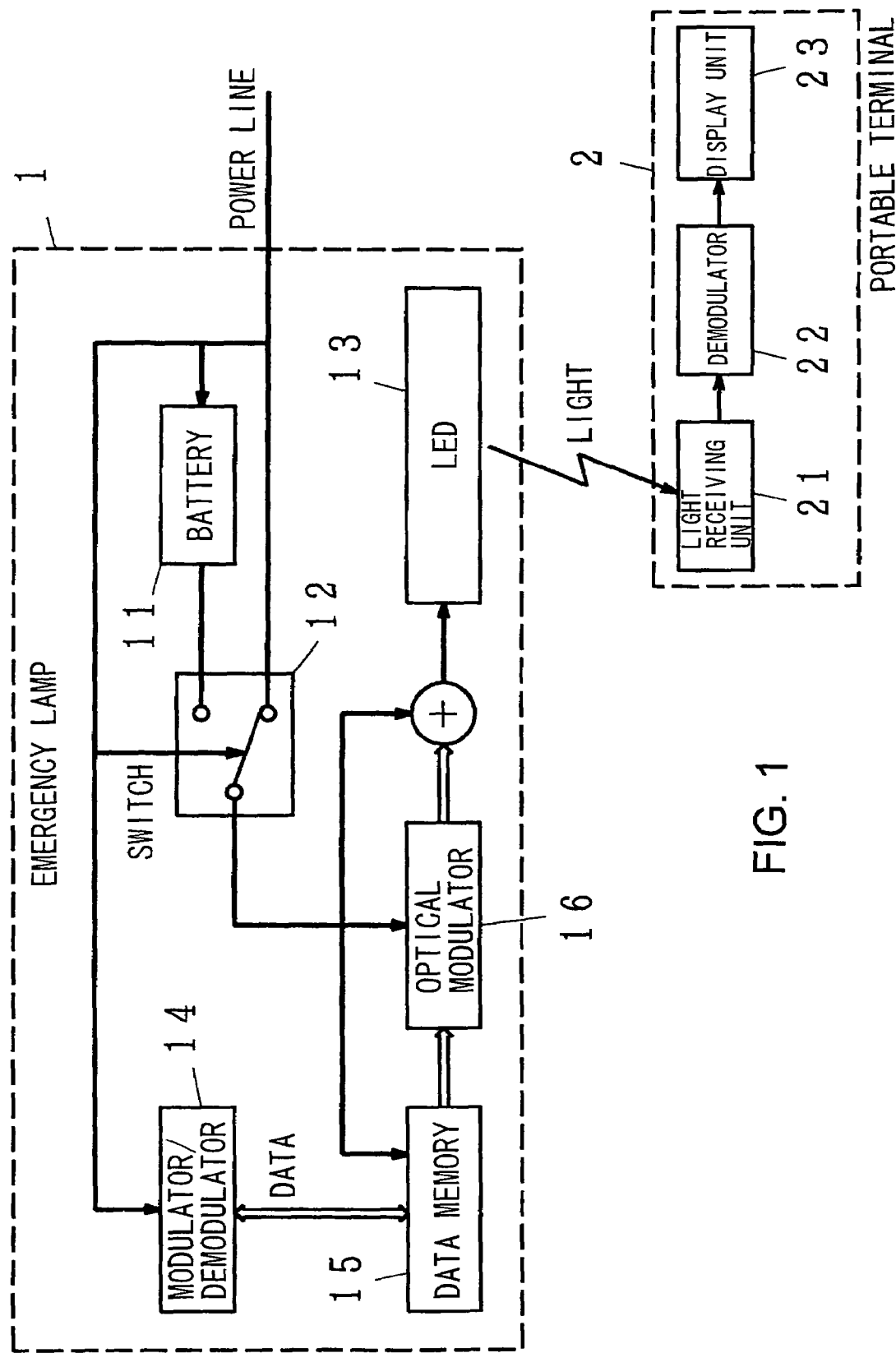
FIG. 1 is a block diagram of an emergency light and a wireless emergency light data communication system, according to an embodiment of the present invention.
Figure 2B:
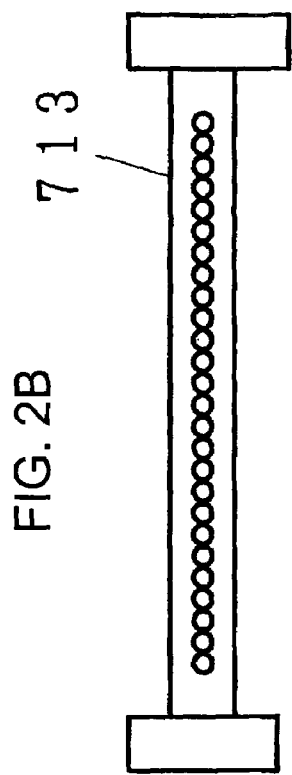
FIGS. 2A-2C each shows exemplary LED array used as a light source.
Figure 2C:
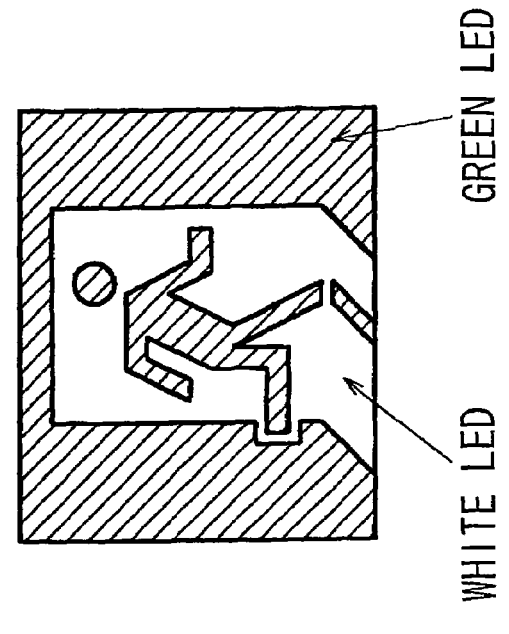
Figure 2A:
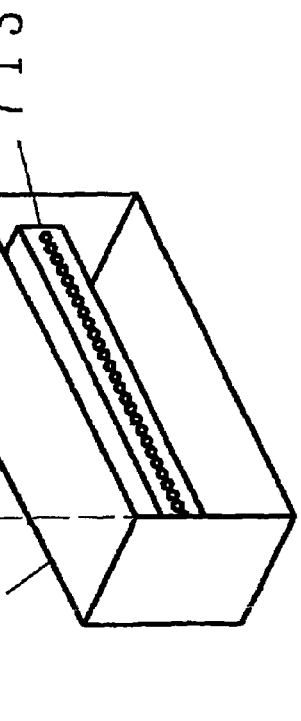

FIG. 1 is a block diagram of an emergency light and a wireless emergency light data communication system, according to an embodiment of the present invention. FIGS. 2A-2C each shows a diagram describing an exemplary LED array used as a light source. In the drawings, 701 denotes an emergency light, 702 denotes a portable terminal, 711 denotes a battery, 712 denotes a switch, 713 denotes an LED array, 714 denotes a modulator/demodulator, 715 denotes data memory, 716 denotes an optical modulator, 721 denotes a light receiving unit, 722 denotes a demodulator, 723 denotes a display unit, and 731 denotes a cover. The emergency light 701 has the battery 711 as a power source in addition to an external power source, as with typical conventional emergency lights, and the switch 712 to switch a power supply source from the external power source to the battery 711 when power supply from the external power source stops.

In the present invention, the LED array 713, instead of a conventional fluorescent light, is used as the illuminative light source. FIG. 2 shows an exemplary shape of the LED array 713. In the example shown in FIG. 2A, as with typical emergency lights, the LED array 713 is provided in the cover 731 on which a pictorial mark is displayed. When using it in such a manner, the rod-shaped LED array 713 similar to a fluorescent lamp is used, as shown in FIG. 2B. For example, LED devices should be arranged in one or more rows. In addition, such LED array 713 may be used as a substitute for a DC lighting fluorescent lamp. Accordingly, the emergency light, according to the present invention, may be structured only by replacing a fluorescent light in the conventionally available emergency light with the LED array 713 as shown in FIG. 2B. In this case, when AC electric power is supplied from a power line, the emergency light should be driven by DC electric power, which is provided through conversion by an AC-DC converter. Moreover, with an emergency light using AC lighting fluorescent light, a DC-AC converter should be embedded in the LED array 713 and used while being driven by the battery 711. Note that use of this such-shaped LED array 713, which can be substituted for a fluorescent lamp, allows provision of the emergency light with the same shape as that of the conventional emergency light in appearance.

In addition to the structure using the LED array as a substitute for the conventional fluorescent lamp, the LED array 713 may directly display a pictorial mark, which has been put on the cover 731, as shown in FIG. 2C. In the case of a pictorial mark indicating emergency exits, since the pictorial mark is typically designed in white and green, it can be displayed by arranging white and green LEDs in place. Needless to say, a pictorial mark may be displayed by arranging LEDs in the same manner as a color display apparatus. Note that in such cases, a transparent material should be used as the cover 731.

Use of an LED array as a light source for the emergency light 701 in this manner and an advantage of LEDs having low power consumption allows provision of the same lighting time with a small-capacity battery as that by prior art, reduction in size of the battery 711, reduction in size and weight of the emergency light 701, and reduction in cost. On the other hand, if the battery has the same capacity as that of the prior art, the emergency light may be on over a long period of time, allowing an escape guiding display to be displayed for a long time when a disaster occurs. Moreover, a feature of long-lived LEDs allows extension of maintenance intervals, such as replacement of a light source, and decrease in man-hour for maintenance work, resulting in reduction in maintenance cost. Needless to say, it is desirable that maintenance for keeping performance, such as checking stains and battery life, and checking whether lighting is possible against a disaster, should be continued. Furthermore, since LEDs are highly crash proof, it can be expected that a light source will not be damaged and will continue to illuminate even when a devastating disaster occurs.

The emergency light 701 according to the present invention shown in FIG. 1 further includes the modulator/demodulator 714, the data memory 715, and the optical modulator 716. A communication method using a power line for supplying electric power from the external power source is used for transmitting data to the emergency light 701. The modulator/demodulator 714 separates and demodulates modulated data which is superimposed on a voltage from the external power source, and then stores the resulting demodulated data in the data memory 715. For example, data to be transmitted from the emergency light 701 while in an emergency can be transmitted from a computer via a power line. Accordingly, data may be distributed to the emergency light 701 via an external power source while not in an emergency, which allows easy storage of data in the data memory 715. In addition, various pieces of data, such as data stored in the data memory 715 or the status of the emergency light 701, may be modulated and then transmitted via the power line. This allows remote confirmation of rewritten data and remote determination of the operation of the emergency light 701. Note that in the case of not carrying out bidirectional communication, the modulator/demodulator 714 may be structured to function as a mere demodulator. In the case of data to be transmitted while in an emergency being pre-stored in the data memory 715, the modulator/demodulator 714 is unnecessary.

Data to be transmitted while in an emergency may be stored in the data memory 715. It is desirable that the power consumption of the data memory 715 is minimal. In addition, it is necessary to prevent stored data from being accidentally erased while changing over the power source. For example, rewritable ROM or nonvolatile RAM should be used.

Upon detection of an emergency, such as an event of the switch 712 having changed over from the external power source to the battery 711, the optical modulator 716 reads out data to be transmitted while in an emergency from the data memory 715, modulates it, and then superimposes the resulting modulated data on an electric power waveform that is supplied to the LED array 713. This allows control of blinking or light intensity of light emitted from the LED array 713 in accordance with data modulated by the optical modulator 716. This allows optical data communication. Needless to say, even while not in an emergency, data communication is possible by modulating data stored in the data memory 715 and providing the resulting modulated data to the LED array 713. In this case, data may differ from that to be transmitted while in an emergency.

The portable terminal 702, which includes the light receiving unit 721, the demodulator 722, and the display unit 723, may be, for example, a PDA with a camera or a cellular phone with a camera. The light receiving unit 721, which may be structured with a camera or a photodiode, receives and converts light emitted from the LED array 713 in the emergency light 701 to an electric signal.

The demodulator 722 extracts a modulated data signal from an electric signal transmitted from the light receiving unit 721, demodulates it, and then captures data. The captured data is available for various applications. In this working example, the captured data is displayed on the display unit 723. As a result, data optically transmitted from the emergency light 701 while in an emergency is displayed on the display unit 723. Text and picture data, such as a map regarding emergency exits or escape routes for evacuees on a floor, may be displayed on the display unit 723. Moreover, voice data may be transmitted, and if a speaker is embedded like a cellular phone, voice data can be easily captured.

An exemplary operation and an application of the emergency light and the wireless emergency light data communication system, according to the embodiment of the present invention, is described forthwith. Data to be transmitted to the data memory 715 while in an emergency should be pre-stored in the emergency light 701. According to a certain method, power line communication is used for transmitting modulated data, as described above, which is superimposed on an external power source waveform, to the emergency light 701, which then receives and demodulates modulated data transmitted from the external power source, thereby capturing data. Alternatively, data is pre-stored in external ROM, and the external ROM may be fixed, as the data memory 715, to the emergency light 701. For example, a memory card may be fixed thereto.

While in an emergency, the optical modulator 716 reads out data from the data memory 715, modulates it, and then superimposes the resulting modulated data on an electric power source waveform to be supplied to the LED array 713. When the electric power on which modulated data is superimposed is supplied to the LED array 713, the LED array 713 then emits light, and light intensity or blinking is controlled allowing optical data transmission.

Moreover, a possessor of the portable terminal 702 can receive data optically transmitted from the emergency light 701 by facing the possessed portable terminal 702 to the emergency light 701 while in an emergency. While in an emergency, people often get lost, and even while evacuating according to emergency lights, they may feel anxious about no information as to how long it takes to evacuate. However, according to the present invention, further detailed various pieces of visual data (or voice data), such as building names, a map of staircases and floors, escape routes for evacuees, and a remaining distance in meters from emergency exits, which the conventional emergency light cannot provide, can be obtained from the emergency light 701. This eases anxiety to a certain extent, allowing more rapid evacuation.

Typically, since the portable terminal 702 may often be driven by a battery, it may be effectively used while in an emergency. Accordingly, use of the emergency light, which emits light without an external power source while in an emergency, and the portable terminal 702, which does not need the external power source, together allows smooth escape guidance while in an emergency, in particular, even when the external power source is cut off.

Moreover, the emergency light 701, according to the present invention, needs electric power to be supplied to the optical modulator 716 or related units. However, necessary electric power for such electronic circuits to operate is much less than electric power for emitting light. Therefore, even when including such optical data communication capability, reinforcement of the battery 711 for the emergency light 701 is almost unnecessary. Moreover, there is no need to deploy an additional means for significantly suppressing power consumption and transmitting data, as compared to a structure for transmitting radio wave, voice and the like as well as light. For example, in the case of infrared rays, similar power consumption is unavoidable, and an additional transmitter must be provided. In view of reduction in power consumption and simplification of a device, optical data communication using an LED light source is advantageous.

Needless to say, the LED array 713 in the emergency light 701 emits light to display guidance to emergency exits and escape routes for evacuees as with the typical emergency light, and is effective for people who do not have the portable terminal 702 while in an emergency. Even when light intensity and/or blinking is controlled for data communication, such change in light intensity is unperceivable to the human eye. Therefore, the functionality as the emergency light will not be lost. In addition to this, utilization of the features of LEDs provides further enhanced functionality as an emergency light than that of the conventional emergency light.

Moreover, data communication by the emergency light 701 is not limited to an emergency. For example, data stored in the data memory 715 may always be optically transmitted. Alternatively, it is possible to transmit information of surrounding shops and news to the portable terminal 702 by pre-storing non-emergency data as well as emergency data in the data memory 715 and changing over between those pieces of data according to whether or not it is an emergency by the optical modulator 716. Once the emergency light 701 is switched on, it is never switched off and is always on day and night. Therefore, a user of the portable terminal 702 can always capture data from the emergency light 701. In addition, since the content of the data memory can be updated as needed through power line communication as described above, real time distribution of data to the portable terminal 702 while not in an emergency is possible.

The case of capturing data through power line communication and case of storing data in the data memory 715 in advance have been described above. However, the present invention is not limited to those cases, and various methods for transmitting data to the emergency light 701 are available.

Figure 3:
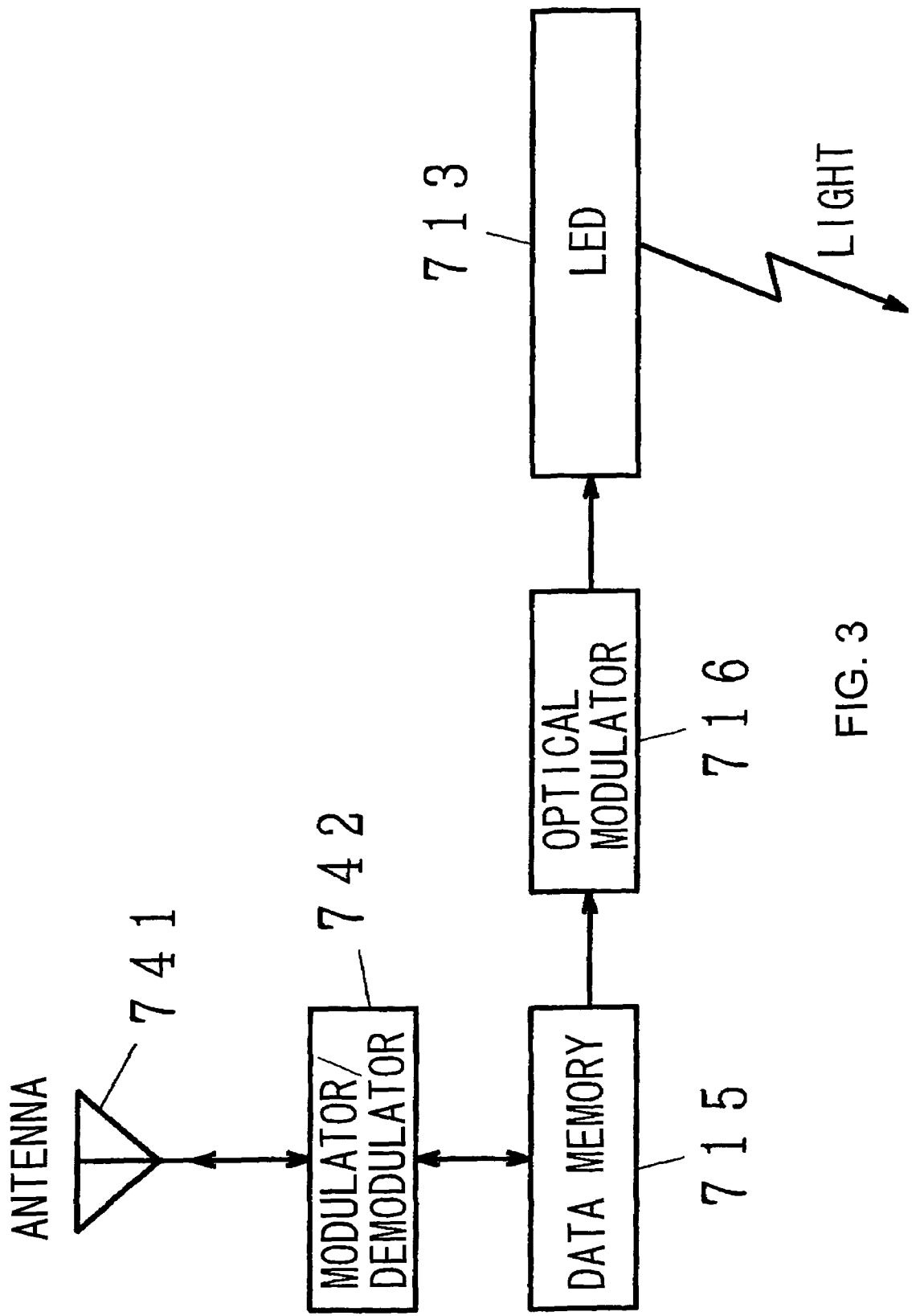
FIG. 3 is a block diagram of an emergency light and a wireless emergency light data communication system, according to an embodiment of the present invention.

FIG. 3 is a block diagram of an emergency light and a wireless emergency light data communication system, according to another embodiment of the present invention. In the drawing, 741 denotes an antenna, and 742 denotes a modulator/demodulator. In the example shown in FIG. 3, the emergency light 701 receives data transmitted from the outside via radio wave and then stores it in the data memory 715. Data received by the antenna 741 is demodulated by the modulator/demodulator 742, and the resulting demodulated data is then stored in the data memory 715. Such data reception should be carried out while not in an emergency. Since electric power can be supplied from the external power source while in an emergency, such radio wave data reception is possible. Needless to say, in the case of broadcasting data, mere demodulating capability is required to the modulator/demodulator 742.

Furthermore, other than radio waves as shown in FIG. 3, a communication line, such as an optical cable or a communication cable, except for a power line may be utilized to receive data in advance. Note that use of power line communication shown in FIG. 1 develops an advantage that data reception is possible without deploying an antenna or an additional cable.

In this manner, according to the present invention, use of LEDs as a light source allows suppression of battery consumption due to high electric power efficiency of LEDs, reduction in device size due to a reduced battery size, and an extended light emitting time. Moreover, since LEDs have a long operating life, maintenance intervals such as light source replacement intervals can be longer, allowing reduction in maintenance cost. Furthermore, since LEDs are highly crash proof, provision of an emergency light that will not be damaged and be available even when a devastating disaster occurs is possible.

In addition, since LEDs have excellent response characteristics, they may be used as an optical data transmission source by controlling blinking or light intensity thereof. The emergency light includes a battery, allowing continuous light emission even when the electric power supply is cut off due to a disaster. Various pieces of emergency data, such as positional data for emergency exits and emergency staircases, and data for escape routes for evacuees to the emergency exits, which have been pre-stored, can be transmitted using this emitted light. Since provision of such data transmission capability is not costly and does not consume much electric power as compared to the case of providing an additional radio wave or an additional infrared ray transmission system, the capability of emitting light as an emergency light while in an emergency is not lost.

Furthermore, once the emergency light is switched on, it is not switched off semi-permanently and is not influenced by weather and seasons. Therefore, it is generally provided in plain view. Moreover, transmission of not only emergency data, but also general data, such as surrounding advertisements or guidance, is possible. Accordingly, it is expected that the emergency light will be frequently used even while not in an emergency, allowing increase in added value of the emergency light.

What is claimed is:

1. An emergency lamp comprising:
   a battery;
   a light source;
   a storage unit that stores data;
   an optical modulator that controls electric power supplied to the light source from the battery in accordance with the data stored in the storage unit, thereby controlling light intensity or blinking of the light source; and
   a demodulator that separates and demodulates the data superimposed on a voltage of an external power source while the emergency lamp is being driven by the external power source during a non-emergency time,
   wherein data captured by the modulator is stored in the storage unit.

2. The emergency lamp according to claim 1, wherein the light source is an LED.

3. The emergency lamp according to claim 1, wherein the light source is illuminable without electric power from the external power source being supplied to the light source.

4. A wireless emergency lamp data transmission system for transmitting data to a terminal unit using the emergency lamp according to claim 1.

5. The wireless emergency lamp data transmission system according to claim 4, wherein the terminal unit comprises:
   a light receiving unit that receives light emitted from the light source and converts the light to an electric signal; and
   a demodulator that demodulates the electric signal, thereby capturing the data.

6. The wireless emergency lamp data transmission system according to claim 4, wherein the light source is illuminable without electric power from the external power source being supplied to the light source.

7. The wireless emergency lamp data transmission system according to claim 4, wherein the light source is illuminated during an emergency.

* * * * *